(12) United States Patent
Kang et al.

(10) Patent No.: US 7,309,916 B2
(45) Date of Patent: Dec. 18, 2007

(54) SEMICONDUCTOR PACKAGE AND METHOD FOR ITS MANUFACTURE

(75) Inventors: Suk-Chae Kang, Gyeonggi-do (KR); Sa-Yoon Kang, Seoul (KR); Dong-Han Kim, Gyeonggi-do (KR); Si-Hoon Lee, Gyeonggi-do (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 11/173,853

(22) Filed: Jun. 30, 2005

(65) Prior Publication Data

US 2006/0012026 A1 Jan. 19, 2006

(30) Foreign Application Priority Data

Jul. 14, 2004 (KR) .................. 10-2004-0054853

(51) Int. Cl.
*H01L 23/48* (2006.01)
(52) U.S. Cl. ................ 257/697; 257/707; 257/E23.024
(58) Field of Classification Search ............... 257/697, 257/698, 699, 708, 710, 924, E23.057, E23.067; 438/121, 122, 902
See application file for complete search history.

(56) References Cited

U.S. PATENT DOCUMENTS

| 442,877 | A | | 12/1890 | Crane et al. | |
|---|---|---|---|---|---|
| 4,382,327 | A | * | 5/1983 | Bardens et al. | 29/832 |
| 5,006,922 | A | * | 4/1991 | McShane et al. | 257/697 |
| 5,006,963 | A | * | 4/1991 | Spangler et al. | 361/807 |
| 5,025,347 | A | * | 6/1991 | Shindo et al. | 361/719 |
| 5,098,864 | A | * | 3/1992 | Mahulikar | 29/837 |
| 6,720,206 | B2 | * | 4/2004 | Choi | 438/114 |
| 2005/0098875 | A1 | * | 5/2005 | Kikuchi et al. | 257/700 |

FOREIGN PATENT DOCUMENTS

| JP | 61-8959 | 1/1986 |
|---|---|---|
| JP | 1-108734 | 4/1989 |
| JP | 10-163366 | 6/1998 |
| KR | 1999-025075 | 4/1999 |

OTHER PUBLICATIONS

English language abstract of Japanese Publication No. 10-163366.
English language abstract of the Korean Publication No. 1999-025075.
English language abstract of the Japanese Publication No. 61-8959.
English language abstract of the Japanese Publication No. 1-108734.

* cited by examiner

*Primary Examiner*—Evan Pert
*Assistant Examiner*—Benjamin P. Sandvik
(74) *Attorney, Agent, or Firm*—Marger Johnson & McCollom, P.C.

(57) ABSTRACT

A semiconductor package includes a metal plate in which one or more openings are formed, the metal plate mounting a semiconductor chip and a printed wire pattern substrate, e.g. a PCB, mounting one or more decoupling capacitors. The semiconductor chip is in direct contact with the metal plate to improve thermal characteristics, and the substrate is supported by the metal plate to increase mechanical stability of the package. The one or more openings in the metal plate accommodate the passing therethrough of plural pins electrically connected via the printed wire pattern substrate to the semiconductor chip. The semiconductor package can be usefully applied to a digital micro-mirror device (DMD) semiconductor package for use in a projection display device.

17 Claims, 4 Drawing Sheets

SEMICONDUCTOR PACKAGE AND METHOD FOR ITS MANUFACTURE

CROSS-REFERENCE TO RELATED APPLICATIONS

This U.S. non-provisional patent application claims priority under 35 U.S.C. § 119 of Korean Patent Application 2004-54853 filed on Jul. 14, 2004, the entire contents of which are hereby incorporated by reference.

BACKGROUND OF THE INVENTION

The invention is concerned with a semiconductor package, and more particularly, to a PGA package.

A sheet of wafer material is able to contain several dozens to several hundreds of chips, on which the same electrical circuits are printed. However, the chip cannot be supplied with electricity from the exterior to transmit or receive electrical signals by itself. In addition, since the chip contains micro-circuits, the chip may be easily damaged by external impacts. A package process is a procedure of making a semiconductor package having physical functions and shapes so that the chip is electrically connected and hermetically packaged to endure the external impacts to thereby render it usable in real life or environment.

Generally, the semiconductor package is classified into a resin sealing package, a tape carrier package (TCP), a glass sealing package, a metal sealing package, etc. These semiconductor packages are also classified into an insert type and a surface mount type depending upon a mounting method. Typically employed as the insert type are a dual in-line package (DIP), a pin grid array (PGA), etc. And typically employed as the surface mounting type are a quad flat package (QFP), a plastic leaded chip carrier (PLCC), a ceramic leaded chip carrier (CLCC), a ball grid array (BGA), etc.

In a conventional semiconductor package, a semiconductor chip is positioned on an accommodating space of a circuit board having a structure that enables a wire pattern to be formed, and the semiconductor chip to be received, and the semiconductor chip to be electrically connected to the wire pattern through bonding wires. Conventionally, the circuit board is made of organic material. That is, the semiconductor chip is adhered on the organic circuit board. The organic material is widely used for the circuit board because its wire pattern can be easily formed and its manufacturing cost is also inexpensive.

However, since the circuit board is formed of the organic material and is in direct contact with the semiconductor chip, thermal characteristics of the semiconductor package may be degraded. In other words, the organic circuit board may be insufficient to discharge a high temperature generated by the semiconductor chip and the circuit board. In addition, the organic circuit board is sensitive to thermal or physical impacts from the exterior.

Meanwhile, a package using ceramic material having improved thermal characteristics over that of the organic material has been proposed and used. However, forming the wire pattern on the ceramic material requires high manufacturing cost in comparison with forming the wire pattern on the organic material. In addition, the ceramic material is also insufficient to provide mechanical stability of the package since it is sensitive to a high external pressure.

In order to solve the problems concerning the mechanical stability of the ceramic material, a metal PGA package using a metal circuit board has been introduced. However, because plural insertion holes should be formed in a metal plate corresponding to a number of pins and an insulating material should fill the respective microscopic insertion holes therein, it causes a process to be complicated and difficult, requiring a high manufacturing cost as well.

SUMMARY OF THE INVENTION

The invention provides a semiconductor package having low cost and high mechanical stability.

In one embodiment, a semiconductor package comprises a metal plate having one or more first openings; a substrate including a wire pattern, the substrate being mounted on the metal plate, the substrate including a second opening that exposes a semiconductor chip attachment region of the metal plate; a semiconductor chip mounted on the chip attachment region of the metal plate and being electrically connected to the wire pattern of the substrate; one or more insulating members within the one or more first openings of the metal plate, the one or more insulating members each including a plurality of pinholes; and a plurality of pins passing through the pinholes, the plurality of pins being electrically connected to the wire pattern of the substrate.

In another embodiment, a circuit board includes a wire pattern and a metal plate to which a semiconductor chip is adhered. The semiconductor chip and the circuit board are adhered on the metal plate using an appropriate adhesive agent. The circuit board has a larger opening than the size of the semiconductor chip, and the semiconductor chip is adhered on the metal plate exposed under the opening.

The wire pattern of a front surface (a surface of the circuit not in contact with the metal plate) of the circuit board and the semiconductor chip are electrically connected to each other through wire bonding, and conductive connecting pins electrically connected to another circuit board are projected from a rear surface (a surface of the circuit board in contact with the metal plate).

The metal plate has an opening through which an insulating member is inserted, and the conductive connecting pins are passed through a plurality of openings formed at the insulating member. For example, the insulating member may be formed of a plastic material. That is, the metal plate has an opening corresponding to only the plastic insulating member having openings corresponding to the number of conductive connecting pins. In this case, forming the openings for the conductive connecting pins on the plastic material can be readily performed by a puncturing process, and its manufacturing cost can also be lowered. In addition, differently from when the openings are formed in the metal plate, there is no necessity of forming individual insulating material to insulate the conductive connecting pins.

On the other hand, the metal plate may include an opening through which a plurality of conductive connecting pins is passing. In this case, synthetic resin such as epoxy resin is filled in the opening of the metal plate to prevent the plurality of conductive connecting pins passing through the opening of the metal plate from bending and to insulate the pins from each other.

In accordance with the semiconductor package of the invention, there is no necessity of forming a plurality of insertion holes corresponding to the number of connecting pins on the metal plate.

In addition, since the metal plate is in direct contact with the semiconductor chip and the circuit board, a package having good thermal radiation characteristics can be provided, and since the metal plate supports the circuit board, the semiconductor package having excellent mechanical stability can also be provided.

The circuit board is formed of, for example, organic material; therefore, it may be possible to decrease package-manufacturing cost since a wire pattern can be readily and inexpensively formed.

In an embodiment of the invention, a metal frame may be additionally attached on a front surface of the circuit board. In this case, the circuit board is interposed between the metal frame and the metal plate; therefore, the mechanical stability of the semiconductor package can be increased.

In an embodiment of the invention, a thermal radiation member may be additionally attached to one or each of the metal plate and the metal frame; therefore, the thermal radiation characteristics of the semiconductor package can be improved.

In an embodiment of the invention, in order to obtain electrical characteristics of a package for a high-speed device, a decoupling capacitor may be additionally formed on a rear surface; in this case, the metal plate has an opening to expose the decoupling capacitor. Preferably, the opening to expose the decoupling capacitor is formed by cutting off a portion of an edge of the metal plate.

The semiconductor package of the invention further includes a hermetic insulating member. The hermetic insulating member protects the circuit board and the semiconductor chip. On the other hand, the hermetic insulating member may not cover a surface of the semiconductor chip. In this case, the semiconductor chip includes a plurality of mirrors on its surface, which is referred to as a digital micro-mirror device (DMD). The DMD is used in digital light processing (DLP) technology of forming an image using mirror reflection. And, datums to align incident light during the DMD operation may be additionally formed on the metal frame.

In the semiconductor package of and embodiment of the invention, positions of the various openings formed at the metal plate, for example, the openings for the conductive connecting pins, the opening to insert the insulating member, the opening to expose the decoupling capacitor, and the opening formed at the circuit board can be variously implemented. Preferably, the opening formed at the circuit board is formed to expose a center portion of the metal plate in the state that the circuit board is attached on the metal plate. At this time, the openings for the insulating member formed at the metal plate are located at both or four sides of the opening of the circuit board. For example, when the opening of the circuit board has a rectangular shape, the openings for the insulating member are formed at two sides or four sides facing each other across the rectangular shaped opening.

BRIEF DESCRIPTION OF THE DRAWINGS

The accompanying drawings are included to provide a further understanding of the invention, and are incorporated in and constitute a part of this specification. The drawings illustrate example embodiments of the invention and, together with the description, serve to explain principles of the invention.

DETAILED DESCRIPTION OF PREFERRED EMBODIMENTS

Preferred embodiments of the invention will be described below in more detail with reference to the accompanying drawings. The invention may, however, be embodied in different forms and should not be constructed as limited to the embodiments set forth herein. Rather, these embodiments are provided so that this disclosure will be thorough and complete, and will fully convey the scope of the invention to those skilled in the art. Like numerals refer to like elements throughout the specification.

In the drawings, some components or members constituting the semiconductor package are exaggerated for clarity. In addition, terms such as first, second and third are used to describe various openings in various embodiment herein below, but these openings are not limited by the terms. Further, the terms are used to merely differentiate any opening from another opening. Therefore, the opening referred to as a first opening in one embodiment may be described as a second opening in another embodiment.

Hereinafter, exemplary embodiments of the invention in conjunction with the accompanying drawings will be described.

Figure 1:
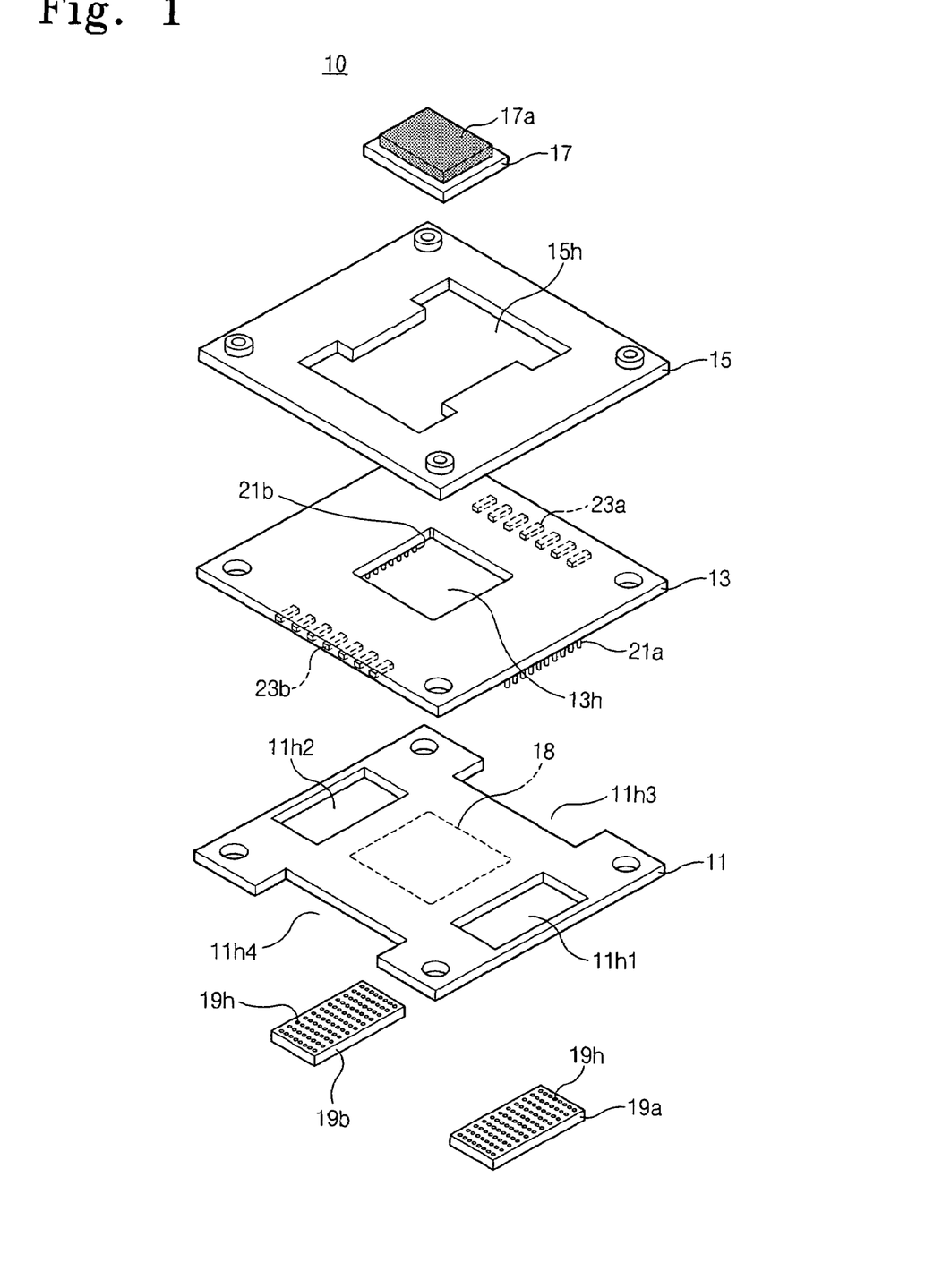
FIG. 1 is an exploded isometric view of a semiconductor package in accordance with a first embodiment of the invention to illustrate components constituting the package.
Figure 2:
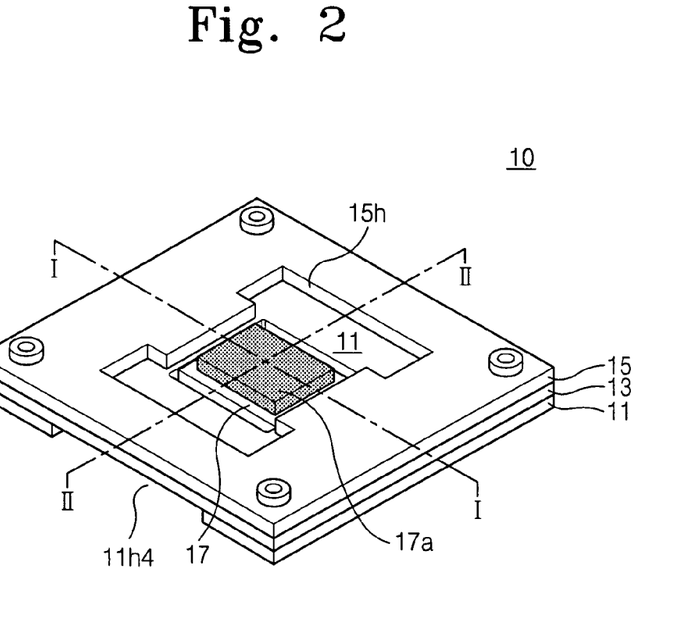
FIGS. 2 and 3 are schematic isometric views of a semiconductor package in accordance with the first embodiment of the invention when the components in FIG. 1 are assembled.

Referring to FIG. 1, a semiconductor package 10 in accordance with the invention includes a metal plate 11 to which a semiconductor chip 17 is attached, and a printed circuit board (PCB), or substrate, 13 (where, it will be understood by those of skill in the art, a wire pattern, not shown, is formed) attached to the metal plate 11, having a second opening 13*h* to expose a region where the semiconductor chip is located. The metal plate 11 has two larger first openings 11*h*1 and 11*h*2 for a plurality of conductive connecting pins 21*a* and 21*b* formed at a rear surface of the circuit board and being electrically connected thereto. In accordance with one embodiment of the invention, the plurality of pins 21*a* pass through the larger first opening 11*h*1 formed at the metal plate 11. Therefore, unlike with the conventional package, there is no need to form pinholes corresponding to the number of pins on the metal plate. The larger first openings 11*h*1 and 11*h*2 are formed at either side of a semiconductor chip attachment region 18 of the metal plate 11. As above, the plurality of conductive connecting pins 21*a* pass though the one larger first opening 11*h*1, and the plurality of conductive connecting pins 21*b* pass though the other larger first opening 11*h*2. In addition, the semiconductor package 10 of the invention includes insulating members 19*a* and 19*b* which are respectively inserted into the first openings 11*h*1 and 11*h*2 of the metal plate 11 to prevent the conductive connecting pins 21*a* and 21*b* from bending and to insulate them from each other. Insulating members 19*a* and 19*b* have pinholes 19*h* corresponding to the conductive connecting pins 21*a* and 21*b*.

The insulating members 19*a* and 19*b* can be formed of a plastic material. The plurality of pinholes in the plastic insulating member can be readily and inexpensively formed by a puncturing method.

Alternatively, instead of using the insulating members 19*a* and 19*b*, the first openings 11*h*1 and 11*h*2 of the metal plate 11 instead could be filled with epoxy resin (after the metal plate 11 and the PCB 13 are assembled, e.g. stacked). The epoxy resin would prevent the plurality of conductive connecting pins passing through the larger first openings 11$h$1 and 11$h$2 from bending and would insulate the pins from each other.

While not shown, to improve thermal characteristics of the package, a thermal radiation member, e.g. a heat sink (not shown) can also be attached to the metal plate 11.

Figure 3:
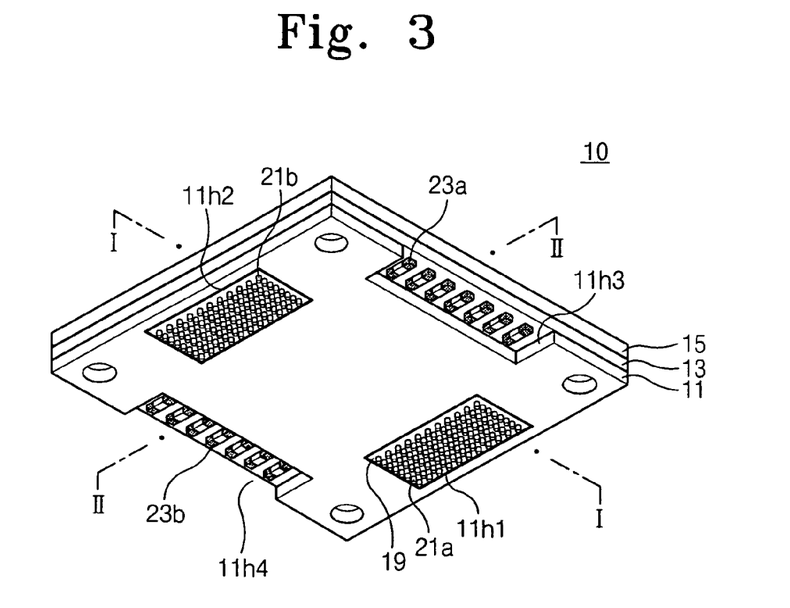

In addition, to obtain high-speed operation of the device, decoupling capacitors 23$a$ and 23$b$ can be formed (e.g. with printed device techniques or with conventional discrete capacitor mountings) at edges of a rear surface of the PCB 13, i.e., on either side of the second opening 13$h$ as shown in FIGS. 1 and 3. In this case, the metal plate 11 further includes third openings 11$h$3 and 11$h$4 to openly accommodate and thus to expose the decoupling capacitors 23$a$ and 23$b$, respectively. The third openings 11$h$3 and 11$h$4 of the metal plate 11 are formed, for example, by strategically cutting or milling the edges of the metal plate 11 as shown in FIGS. 1 and 3.

In addition, to obtain greater mechanical stability of the package, a metal frame 15 may be additionally attached to the front surface of the PCB 13. The metal frame 15 has an opening 15$h$ to openly accommodate and thus to expose the semiconductor chip 17.

In addition, a thermal radiation member, e.g. a heat sink (not shown) can be attached to the metal frame 15.

When the package technology of the invention is applied to a digital micro-mirror device (DMD), a mirror array 17$a$ may be attached on the semiconductor chip 17. In this case, epoxy-molding to protect the circuit board 13 and the semiconductor chip 17 does not coat the mirror array 17$a$ attached on the semiconductor chip 17 (see, for example, molded-epoxy molded insulating member 27 in FIGS. 4 and 5).

Hereinafter, a semiconductor package manufacturing process in accordance with an embodiment of the invention will be described in conjunction with FIGS. 1 through 5. Depending upon the application, a semiconductor chip 17 is manufactured to exhibit desired behavior and performance characteristics. Next, a metal plate 11, a PCB 13, insulating members 19$a$ and 19$b$, and a metal frame 15, as shown in FIG. 1, are prepared. The metal plate 11, which can be readily manufactured by a well-known metal machining process, has larger first openings 11$h$1 and 11$h$2 to accommodate a plurality of pins 21$a$ and 21$b$, and openings 11$h$3 and 11$h$4 to openly accommodate and thus to expose coupling capacitors 23$a$ and 23$b$. Similarly, the metal frame 15 can also be readily manufactured by the conventional metal machining process. The pins 21$a$ and 21$b$, and the coupling capacitors 23$a$ and 23$b$ are formed or formed on the PCB 13, as is the wire pattern, using conventional methods. The insulating members 19$a$ and 19$b$ are formed, e.g. by molding, of, e.g. a plastic material, having a plurality of holes 19$h$ to accommodate the respective pins 21$a$ and 21$b$.

The PCB 13 is attached to the metal plate 11. The plurality of pins 21$a$ are passed through the larger first opening 11$h$1, and the plurality of pins 21$b$ are passed through the larger first opening 11$h$2. Then the coupling capacitors 23$a$ are exposed through the third opening 11$h$3, and the coupling capacitors 23$b$ are exposed through the third opening 11$h$4. The semiconductor chip 17, to which the mirror array 17$a$ is attached, is attached to a chip attachment region 18 of the metal plate 11 using an appropriate adhesive agent. The insulating member 19$a$ is inserted into the larger first opening 11$h$1 and the insulating member 19$b$ is inserted into the larger first opening 11$h$2 to insulate the pins 21$a$ and 21$b$ from each other and to support the pins to prevent their bending. The metal frame 15 is attached to the PCB 13. Alternatively, instead of using the insulating members 19$a$ and 19$b$, appropriate epoxy resin may be used to fill the larger first opening 11$h$1 through which the plurality of pins 21$a$ are passed and the larger first opening 11$h$2 through which the plurality of pins 21$b$ are passed, to insulate each of the plurality of pins 21$a$ and 21$b$ from every other.

The semiconductor chip 17 and the PCB 13 are electrically connected to each other, for example, by wire bonding 25. An epoxy molding process is used to form a hermetic insulating member 27 (see FIGS. 4 and 5) to protect the PCB 13 and the semiconductor chip 17. In the case of the DMD package, the epoxy molding process is performed to prevent the mirror array 17$a$ attached to the semiconductor chip 17 from being covered or otherwise contaminated thereby. In addition, a capping layer (not shown) made of a transparent material is attached in order to protect the mirror array 17$a$. On the other hand, when an additional structure is not attached to the semiconductor chip 17, the semiconductor chip 17 needs another form of protection. In this case, the epoxy molding process can be used to cover a surface of the semiconductor chip 17.

Referring to FIGS. 2 through 5, according to the semiconductor package in accordance with an embodiment of the invention, a rear surface of the circuit board 13 is attached to the metal plate 11, and the semiconductor chip 17 is attached to a portion of the metal plate 11 exposed by the first opening 13$h$ in the PCB 11. Those of skill in the art will appreciate that the semiconductor chip 17 is attached to the metal plate 11 to improve thermal characteristics of the package and that the metal plate 11 is attached to the PCB 13 to mechanically stabilize the package.

Figure 4:
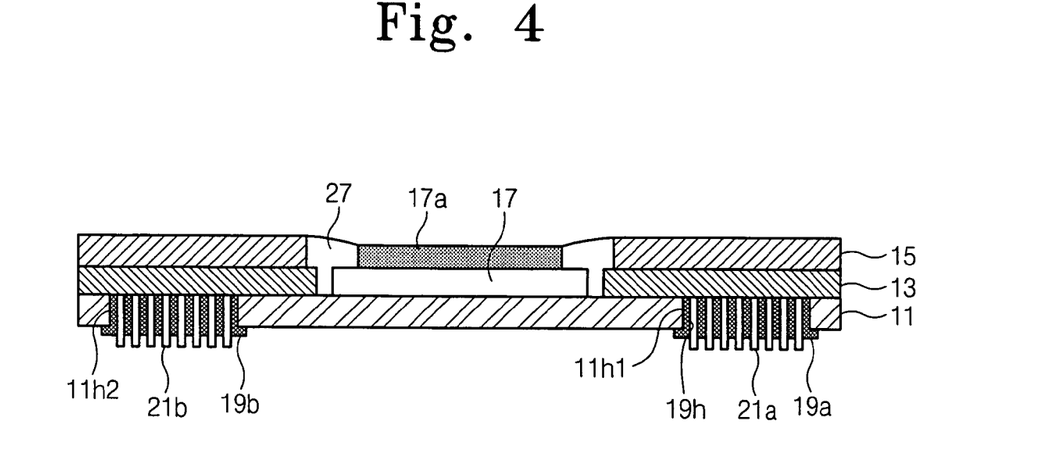
FIGS. 4 and 5 are cross-sectional front and side elevations schematically illustrating a semiconductor package taken along the lines I-I and II-II in FIGS. 2 and 3, respectively, in accordance with the first embodiment of the invention.
Figure 5:
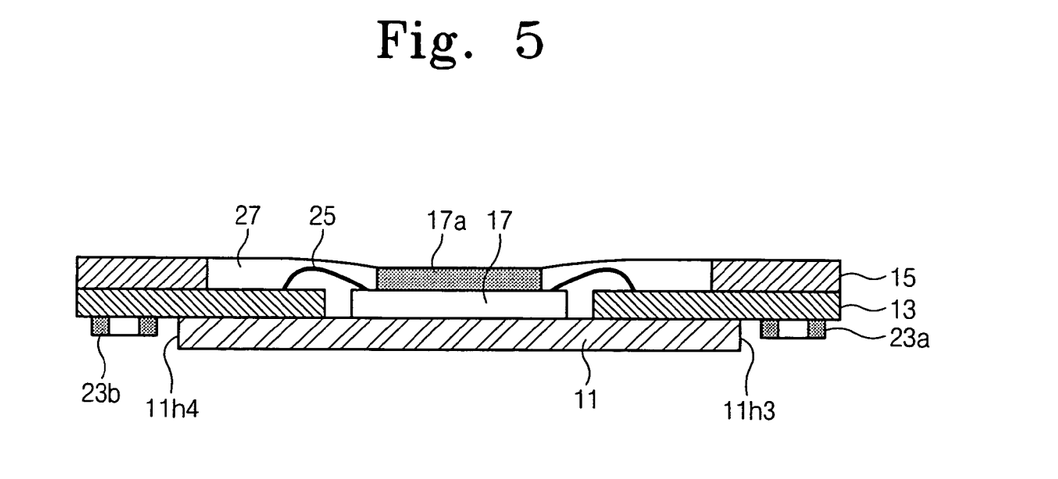

Referring collectively now to FIGS. 3 through 5, the insulating member 19$a$ made of plastic material and having pinholes 19$h$ corresponding to the number of the conductive connecting pins 21$a$ is inserted into the larger first opening 11$h$1 of the metal plate 11, and the conductive connecting pins 21$a$ of the PCB 13 are passed through the pinholes 19$h$ of the insulating member 19$a$. Thus, in accordance with the invention, it is possible to avoid the process of forming the plurality of pinholes in the metal plate 11, which is a difficult and expensive process. In addition, the PCB 13 can be formed using organic material, rendering its manufacturing process easier and less costly.

Those of skill in the art will appreciate that, for the sake of clarity, FIG. 5 omits the plurality of pins 21$b$ that would normally be visible in this side elevation.

Figure 6:
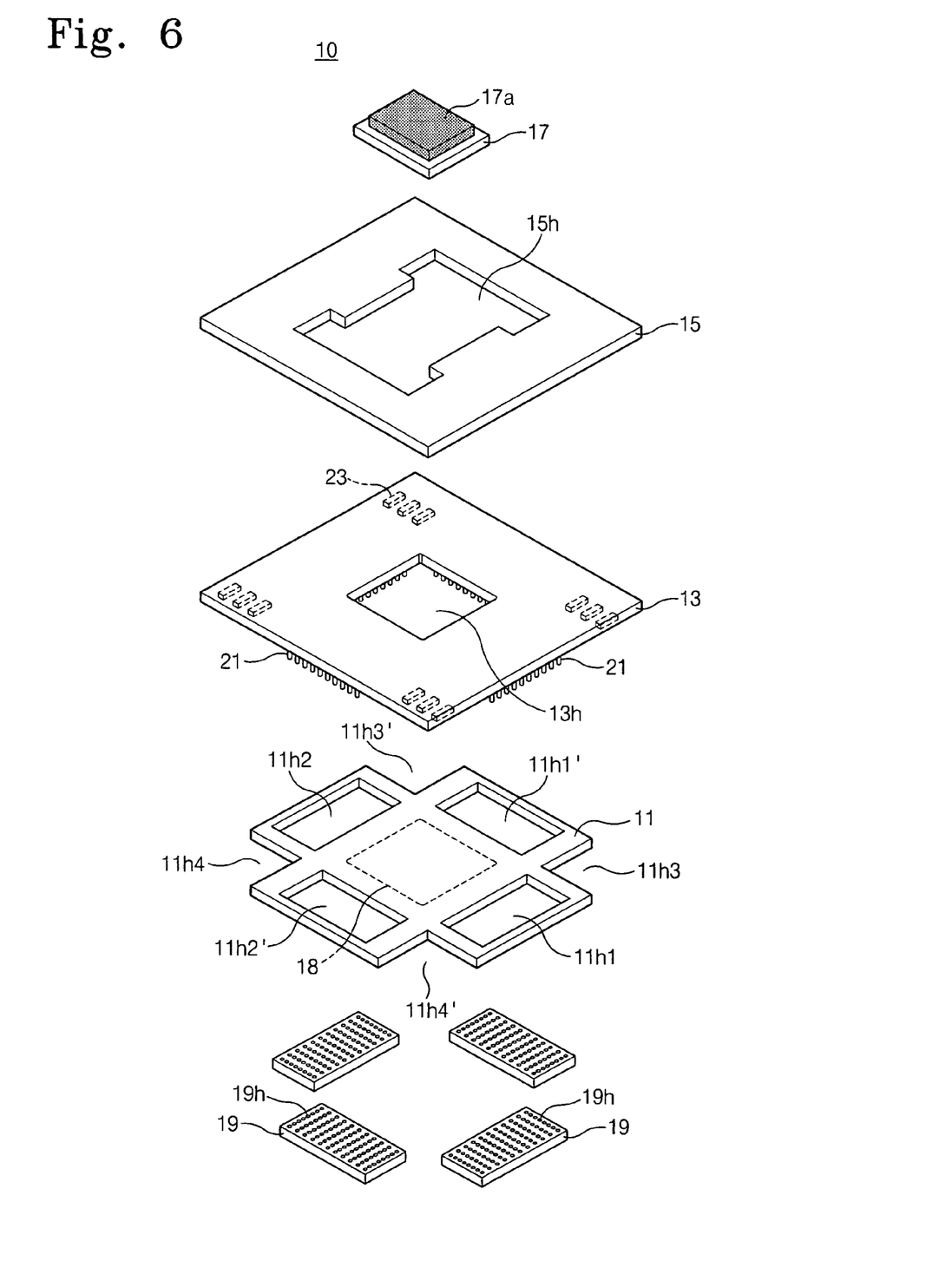
FIG. 6 is an exploded isometric view of a semiconductor package in accordance with a second embodiment of the invention, to illustrate components constituting the package.

FIG. 6 is an exploded isometric view of a semiconductor package illustrating components constituting the semiconductor package in accordance with a second embodiment of the invention.

A semiconductor package 10 of the second embodiment, similar to the first embodiment, includes a metal plate 11 to which a semiconductor chip 17 is attached; a PCB 13 attached to the metal plate 11, the PCB 13 including a second opening 13$h$ to expose a region where the semiconductor chip is located, a wire pattern (not shown) being formed on the PCB 13; and a metal frame 15. However, differently from the previous embodiment, decoupling capacitors 23 are formed adjacent the four corners of the PCB 13, and the metal plate 11 includes four open portions 11$h$3, 11$h$4, 11$h$3', and 11$h$4' that openly accommodate and thus expose the decoupling capacitors 23. In addition, the metal plate 11 includes four openings 11$h$1, 11$h$2, 11$h$1', and 11$h$2' at positions corresponding to four sides of the opening 13$h$ of the PCB 13 (i.e. around the semiconductor chip attachment region 18). Therefore, four insulating members 19, in which pinholes 19*h* for the connecting pins 21 are respectively formed, are inserted into the four openings 11*h*1, 11*h*2, 11*h*1', and 11*h*2' of the metal plate 11.

Since a packaging method of the semiconductor package 10 in accordance with the second embodiment of the invention is similar to the aforementioned first embodiment, its description will not be repeated here.

In the first and second embodiments described and illustrated herein, the number, shape and arrangement of the one or more insulating members 19, the openings for the plurality pins, and the openings for the decoupling capacitors may be variously changed, as suggested.

As can be seen from the foregoing discussion, the invention is capable of providing a package having good thermal radiation characteristics and excellent mechanical stability by attaching a semiconductor chip to a metal plate and the metal plate to a substrate, e.g. a PCB.

In addition, since the PCB is formed of organic material, a wire pattern can be readily and inexpensively formed, and the invented package's manufacturing cost can be decreased.

Further, since plastic material having pinholes corresponding to the number of connecting pins is inserted into a larger first hole formed in the metal plate, there is no need to form pinholes corresponding to the number of the connecting pins in the metal plate itself.

Accordingly, the pinhole-forming and pin-installing processes can be simplified and the package's manufacturing cost reduced.

Although the invention has been described in connection with two embodiments of the invention illustrated in the accompanying drawings, it is not limited thereto. It will be apparent to those skilled in the art that different or further substitutions, modifications, and changes may be made thereto without departing from the scope and spirit of the invention.

What is claimed is:

1. A semiconductor package comprising:
   a metal plate having one or more first openings;
   a substrate mounted on the metal plate, the substrate including a second opening that exposes a semiconductor chip attachment region of the metal plate;
   a semiconductor chip mounted on the chip attachment region of the metal plate and being electrically connected to the substrate;
   one or more insulating members within a respective one of the one or more first openings of the metal plate, each of the one or more insulating members including a plurality of pinholes; and
   a plurality of pins passing through the pinholes, the plurality of pins being electrically connected to the substrate.

2. The semiconductor package as set forth in claim 1, wherein the substrate further includes one or more decoupling capacitors, and wherein the metal plate includes a third opening that exposes the one or more decoupling capacitors of the substrate.

3. The semiconductor package as set forth in claim 1, wherein the insulating members are made of a plastic material, and wherein the substrate is made of an organic material.

4. The semiconductor package as set forth in claim 1, wherein the second opening of the substrate is aligned with a central region of the metal plate, and wherein the one or more first openings of the metal plate are located at any one or more of four sides of the metal plate surrounding the central region thereof.

5. The semiconductor package as set forth in claim 4, wherein the substrate further includes one or more decoupling capacitors, and wherein the metal plate further includes a third opening that exposes the one or more decoupling capacitors of the substrate.

6. The semiconductor package as set forth in claim 1, wherein the second opening of the substrate is aligned with a central region of the metal plate, and wherein the one or more first openings of the metal plate are located at any one or more of four sides of the metal plate surrounding the central region thereof, and wherein the third opening is formed by removing at least a portion of an edge of the metal plate.

7. The semiconductor package as set forth in claim 1, which further comprises:
   a metal frame mounted on the substrate, the metal frame including a fourth opening that exposes the semiconductor chip.

8. The semiconductor package as set forth in claim 1, wherein the semiconductor chip includes a plurality of mirrors on its surface, which further comprises:
   one of the insulating member between the semiconductor chip and the substrate.

9. A semiconductor package comprising:
   a metal plate including a first opening;
   a substrate mounted on the metal plate, the substrate including a generally central second opening that exposes a generally central region of the metal plate;
   a semiconductor chip mounted on a chip attachment region of the metal plate defined by the second opening of the substrate, the semiconductor chip being electrically connected to the substrate; and
   a plurality of pins passing through the first opening and electrically connecting to the substrate.

10. The semiconductor package as set forth in claim 9 which further comprises:
    a synthetic resin that substantially fills in the first opening in the metal plate to insulate and to secure the plurality of pins passing therethrough.

11. The semiconductor package as set forth in claim 9 which further comprises:
    an insulating member inserted into the first opening of the metal plate, the insulating member including a plurality of pinholes corresponding to the plurality of pins.

12. The semiconductor package as set forth in claim 9 which further comprises:
    a metal frame mounted on the substrate, the metal frame including a generally central third opening that exposes the semiconductor chip.

13. The semiconductor package as set forth in claim 9, wherein the substrate further includes one or more decoupling capacitors, and wherein the metal plate includes a third opening that exposes the one or more decoupling capacitors.

14. The semiconductor package as set forth in claim 9, wherein the semiconductor chip includes a plurality of mirrors on its surface.

15. A semiconductor package comprising:
    a conductive plate having one or more first openings;
    a substrate mounted on the conductive plate, the substrate including a second opening that exposes a semiconductor chip attachment region of the conductive plate;

a semiconductor chip mounted on the chip attachment region of the conductive plate and being electrically connected to the substrate;

one or more insulating members within a respective one of the one or more first openings of the metal plate, each of the one or more insulating members including a plurality of pinholes; and a plurality of pins passing through the pinholes, the plurality of pins being electrically connected to the substrate.

16. A semiconductor package comprising:

a metal plate having one or more first openings;

a printed circuit board mounted on the metal plate, the printed circuit board including a second opening that exposes a semiconductor chip attachment region of the metal plate;

a semiconductor chip mounted on the chip attachment region of the metal plate and being electrically connected to the printed circuit board;

one or more insulating members within the one or more first openings of the metal plate, the one or more insulating members including a plurality of pinholes; and a plurality of pins passing through the pinholes, the plurality of pins being electrically connected to the printed circuit board.

17. The semiconductor package as set forth in claim 1, wherein the substrate is a printed circuit board.

* * * * *

UNITED STATES PATENT AND TRADEMARK OFFICE
CERTIFICATE OF CORRECTION

PATENT NO. : 7,309,916 B2
APPLICATION NO. : 11/173853
DATED : December 18, 2007
INVENTOR(S) : Suk-Chae Kang et al.

It is certified that error appears in the above-identified patent and that said Letters Patent is hereby corrected as shown below:

Column 4, line 52, the word "though" should read -- through --;
Column 4, line 53, the word "though" should read -- through --.

Signed and Sealed this

Second Day of September, 2008

JON W. DUDAS
*Director of the United States Patent and Trademark Office*